US008558256B2

(12) United States Patent
Hong et al.

(10) Patent No.: US 8,558,256 B2
(45) Date of Patent: Oct. 15, 2013

(54) LIGHT EMITTING DIODE USING SEMICONDUCTOR NANOWIRE AND METHOD OF FABRICATING THE SAME

(75) Inventors: Ki-ha Hong, Seoul (KR); Young-gu Jin, Hwaseong-si (KR); Jai-kwang Shin, Anyang-si (KR); Sung-Il Park, Suwon-si (KR); Jong-seob Kim, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 887 days.

(21) Appl. No.: 11/976,011

(22) Filed: Oct. 19, 2007

(65) Prior Publication Data

US 2008/0277676 A1 Nov. 13, 2008

(30) Foreign Application Priority Data

May 10, 2007 (KR) .................. 10-2007-0045509

(51) Int. Cl.
*H01L 33/00* (2010.01)
(52) U.S. Cl.
USPC .. 257/89; 257/13; 257/E51.018; 257/E51.04; 257/E33.065; 257/E33.003; 257/103; 977/950
(58) Field of Classification Search
USPC .................................... 257/89, 103
See application file for complete search history.

(56) References Cited

U.S. PATENT DOCUMENTS

| | | | |
|---|---|---|---|
| 6,882,051 B2 * | 4/2005 | Majumdar et al. | 257/746 |
| 7,067,867 B2 * | 6/2006 | Duan et al. | 257/296 |
| 7,254,151 B2 * | 8/2007 | Lieber et al. | 372/44.01 |
| 7,302,856 B2 * | 12/2007 | Tang et al. | 73/777 |
| 7,592,679 B1 * | 9/2009 | Kamins et al. | 257/414 |
| 7,915,151 B2 * | 3/2011 | Lieber et al. | 438/497 |
| 8,026,560 B2 * | 9/2011 | Afzali-Ardakani et al. | 257/415 |
| 2005/0133476 A1 | 6/2005 | Islam et al. | |
| 2005/0267345 A1 * | 12/2005 | Korgel et al. | 600/317 |
| 2008/0081326 A1 * | 4/2008 | Amano | 435/5 |

FOREIGN PATENT DOCUMENTS

| | | |
|---|---|---|
| JP | 2005-322897 | 11/2005 |
| JP | 2006-507692 | 3/2006 |
| JP | 2006-270107 | 10/2006 |

OTHER PUBLICATIONS

Legrand et al, Jour. Vac. Sci. Tech. B 20(3), May/Jun. 2002, "Silicon nanowires . . . measurements". pp. 862-870.*
Pescini et al, Nanotechnology 10 (1999) pp. 418-420 "Suspending . . . nanomechanics".*
JP OA dated Oct. 4, 2012, issued in corresponding Japanese Application No. 2008-123878.
KR OA dated Jul. 17, 2013, issued in corresponding Korean Application No. 2007-0045509.

* cited by examiner

*Primary Examiner* — Jerome Jackson, Jr.
(74) *Attorney, Agent, or Firm* — Harness, Dickey & Pierce, P.L.C.

(57) ABSTRACT

Provided are a light emitting diode (LED) using a Si nanowire as an emission device and a method of fabricating the same. The LED includes: a semiconductor substrate; first and second semiconductor protrusions disposed on the semiconductor substrate to face each other; a semiconductor nanowire suspended between the first and second semiconductor protrusions; and first and second electrodes disposed on the first and second protrusions, respectively.

10 Claims, 10 Drawing Sheets

LIGHT EMITTING DIODE USING SEMICONDUCTOR NANOWIRE AND METHOD OF FABRICATING THE SAME

CROSS-REFERENCE TO RELATED PATENT APPLICATION

This application claims the benefit of Korean Patent Application No. 10-2007-0045509, filed on May 10, 2007, in the Korean Intellectual Property Office, the disclosure of which is incorporated herein in its entirety by reference.

BACKGROUND OF THE INVENTION

1. Field of the Invention

The present invention relates to a light emitting diode (LED) and a method of fabricating the same, and more particularly, to an LED using a semiconductor nanowire as an emission device and a method of fabricating the same.

2. Description of the Related Art

Conventionally, III-V group or II-VI group compound semiconductor materials, for example, GaN, have been used for light emitting diodes (LEDs). However, fabrication process technology of III-V group and II-VI group compound semiconductor materials is not as developed as silicon(Si)-based fabrication process technology, and forming a P-N junction is considerably troublesome because it is difficult to dope III-V group and II-VI group compound semiconductor materials. Thus, fabrication of LEDs is costly and takes much time. Nevertheless, III-V group and II-VI group compound semiconductor materials are being commonly adopted for LEDs due to the fact that they have very large direct bandgaps.

Meanwhile, Si-based process technology and various Si doping techniques have already been developed. However, since Si has a characteristic of having a small indirect bandgap, it has been utilized for typical rectifier diodes, transistors, CMOS devices for circuits, and memories rather than for LEDs.

As a result of recent research, it was confirmed that at nanoscale level Si makes the transition to a direct bandgap. In particular, it was observed that as the diameter of Si nanowires decreases, their bandgaps gradually increase due to a quantum confinement effect. Thus, when the diameter of a Si nanowire is less than 10 nm, visible light may be emitted. Noticeably, when the diameter of a Si nanowire is approximately 1.5 nm, it is possible to emit blue light.

Conventionally, formation of Si nanowires has been performed using a bottom-up technique in which crystalline Si nanowires are grown on a substrate. However, according to the bottom-up technique, forming uniform nanowires is difficult and takes much time. Furthermore, it is quite difficult to combine the bottom-up technique with a typical semiconductor fabrication process known as a top-down technique.

SUMMARY OF THE INVENTION

The present invention provides a light emitting diode (LED) using a semiconductor nanowire that is fabricated using well known conventional semiconductor fabrication processes.

Also, the present invention provides a method of fabricating an LED in which a semiconductor nanowire is formed using an ordinary semiconductor fabrication process so that LEDs can be fabricated in large quantities at low cost.

According to an aspect of the present invention, there is provided an LED including: a semiconductor substrate; first and second semiconductor protrusions disposed on the semiconductor substrate to face each other; a semiconductor nanowire suspended between the first and second semiconductor protrusions; and first and second electrodes disposed on the first and second protrusions, respectively.

The first semiconductor protrusion and a portion of the semiconductor nanowire extending from the first semiconductor protrusion may be doped with P-type impurities, and the second semiconductor protrusion and the remaining portion of the semiconductor nanowire extending from the second semiconductor protrusion may be doped with N-type impurities.

A plurality of semiconductor nanowires may be arranged between the first and second semiconductor protrusions.

The semiconductor nanowires may have the same diameter.

In another embodiment, the semiconductor nanowires may have different diameters.

The semiconductor that is used to form the semiconductor substrate, the first and second semiconductor protrusions, and the semiconductor nanowire may be formed of silicon (Si).

The semiconductor nanowire may have a diameter of less than 10 nm.

According to another aspect of the present invention, there is provided a method of fabricating an LED. The method includes: sequentially forming a sacrificial layer, a semiconductor layer, and a first mask layer on a semiconductor substrate and removing both sides of the first mask layer by etching in a first direction; forming an oxide layer to cover lateral surfaces of the semiconductor substrate, the sacrificial layer, and the semiconductor layer and exposed portions of a top surface of the semiconductor layer; forming a second mask layer on the oxide layer and removing the center of the second mask layer by etching in a second direction perpendicular to the first direction; etching portions of the first mask layer and the semiconductor layer interposed between the second mask layer and the oxide layer until a top surface of the sacrificial layer is exposed, to form first and second semiconductor protrusions on both sides of a top surface of the semiconductor substrate; removing the oxide layer interposed between the second mask layers; removing the sacrificial layer interposed between the second mask layers and simultaneously, etching the semiconductor layer interposed between the first and second semiconductor protrusions to form a semiconductor nanowire; removing the remaining first and second mask layers and oxide layer; and forming first and second electrodes on the first and second semiconductor protrusions, respectively.

The method may further include doping the first semiconductor protrusion and a portion of the semiconductor nanowire extending from the first semiconductor protrusion with P-type impurities and doping the second semiconductor protrusion and the remaining portion of the semiconductor nanowire extending from the second semiconductor protrusion with N-type impurities.

The doping process may include: doping all of the first and second semiconductor protrusions and the semiconductor nanowire with N-type impurities; coating the second semiconductor protrusion and the portion of the semiconductor nanowire extending from the second semiconductor protrusion with resist; doping the first semiconductor protrusion and the portion of the semiconductor nanowire extending from the first semiconductor protrusion with P-type impurities; and removing the resist.

Before forming the first mask layer, the method may further include doping a portion of the semiconductor layer with P-type impurities and doping the remaining portion of the semiconductor layer with N-type impurities.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
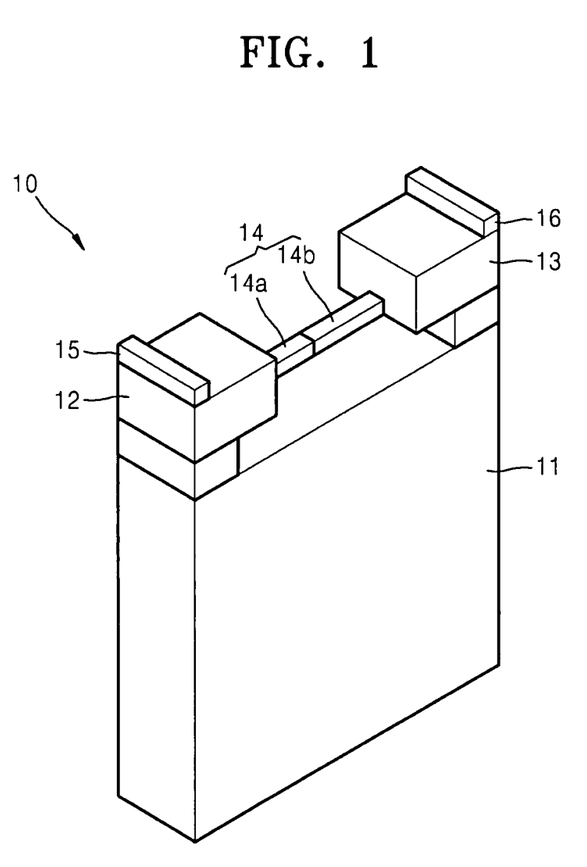
FIG. 1 is a perspective view of a light emitting diode (LED) using a semiconductor nanowire according to an embodiment of the present invention.

FIG. 1 is a perspective view of a light emitting diode (LED) 10 using a semiconductor nanowire according to an embodiment of the present invention.

Referring to FIG. 1, the LED 10 includes a semiconductor substrate 11, first and second semiconductor protrusions 12 and 13 disposed on the semiconductor substrate 11 to face each other, a semiconductor nanowire 14 suspended between the first and second semiconductor protrusions 12 and 13, and first and second electrodes 15 and 16 disposed on the first and second semiconductor protrusions 12 and 13, respectively. Also, the first semiconductor protrusion 12 and a portion 14a of the semiconductor nanowire 14 extending from the first semiconductor protrusion 12 may be doped with P-type impurities, while the second semiconductor protrusion 13 and the remaining portion 14b of the semiconductor nanowire 14 extending from the second semiconductor protrusion 13 may be doped with N-type impurities.

The semiconductor substrate 11, the first and second semiconductor protrusions 12 and 13, and the semiconductor nanowire 14 may be formed of silicon (Si). In this case, fabrication cost can be reduced because conventional semiconductor fabrication processes can be employed as they are, and it is easier to perform a P-N doping process than when using III-V group or II-VI group compound semiconductor materials. Also, when the semiconductor substrate 11, the first and second semiconductor protrusions 12 and 13, and the semiconductor nanowire 14 are formed of Si, a low-resistance ohmic contact may be obtained between the first and second semiconductor protrusions 12 and 13 and the first and second electrodes 15 and 16, thereby further enhancing the luminous efficiency of the LED. However, the present invention is not limited to Si and the semiconductor substrate 11, the first and second semiconductor protrusions 12 and 13, and the semiconductor nanowire 14 may be formed of other semiconductor materials, for example, germanium (Ge). Also, even III-V or II-VI group compound semiconductor materials may be used to fabricate the LED using the semiconductor nanowires according to the present invention.

In this construction, when a voltage is applied to the first and second electrodes 15 and 16, electrons and holes combine in a P-N junction of the semiconductor nanowire 14, thus emitting light. In order that the semiconductor nanowire 14 formed of Si may emit light, as described above, the semiconductor nanowire 14 should have a small enough diameter such that it has a direct bandgap. For example, the diameter of the semiconductor nanowire 14 formed of Si may be about 10 nm or less, more preferably, 5 nm or less. In particular, the diameter of the semiconductor nanometer 14 may be about 1.5 nm in order to emit blue light.

Figure 2:
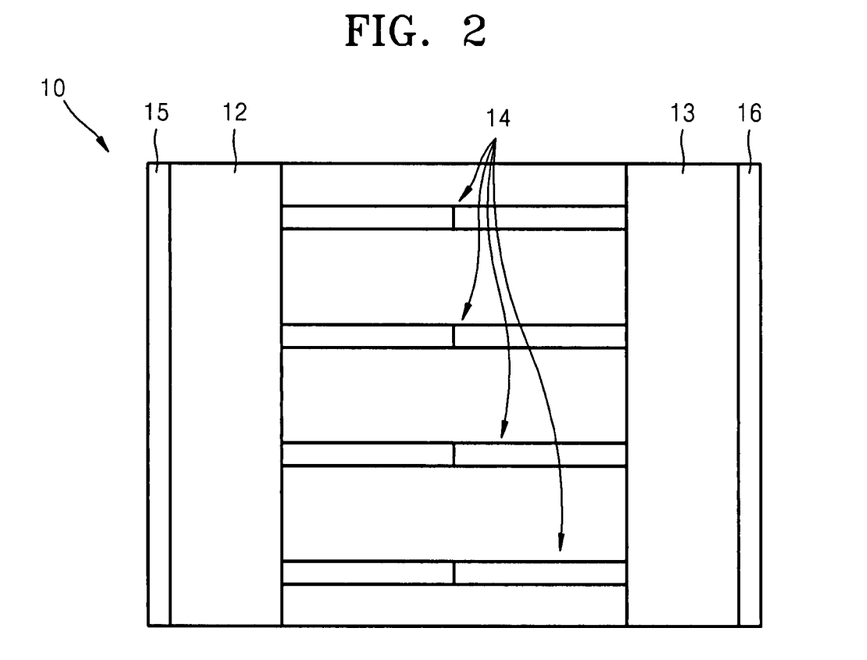
FIG. 2 is a plan view of an LED having a plurality of semiconductor nanowires according to an embodiment of the present invention.

Although FIG. 1 illustrates that only one semiconductor nanowire 14 is connected between the first and second semiconductor protrusions 12 and 13, a plurality of semiconductor nanowires 14 may be provided. FIG. 2 is a plan view of an LED 10 having a plurality of semiconductor nanowires 14 according to an embodiment of the present invention. Referring to FIG. 2, a plurality of semiconductor nanowires 14 may be formed in a row between the first and second semiconductor protrusions 12 and 13.

According to the present invention, the semiconductor nanowires 14 may have the same diameter. In this case, the LED 10 according to the present invention may emit light with a single wavelength. For example, when all the semiconductor nanowires 14 have a diameter of about 1.5 nm, the LED 10 according to the present invention emits blue light. However, the semiconductor nanowires 14 may be formed to have different diameters if required. For example, the diameters of the semiconductor nanowires 14 may uniformly range from 1.5 nm to 5 nm, so that the LED 10 may emit white light.

Hereinafter, a method of fabricating an LED according to an embodiment of the present invention will be described with reference to FIGS. 3A through 3J.

Figure 3A:
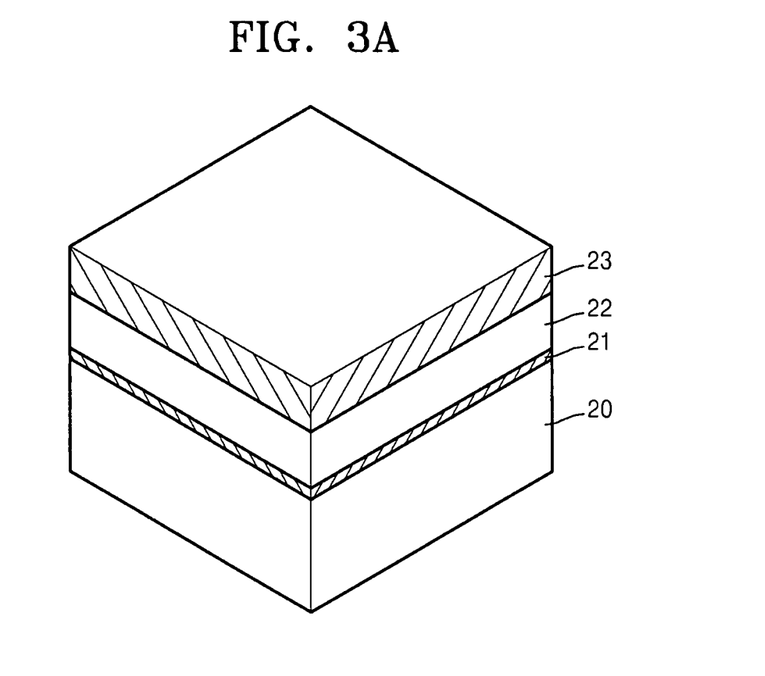
FIGS. 3A through 3J are diagrams illustrating a method of fabricating an LED using a semiconductor nanowire according to an embodiment of the present invention.

Referring to FIG. 3A, a sacrificial layer 21, a semiconductor layer 22, and a first mask layer 23 are sequentially stacked on a semiconductor substrate 20, for example, a Si substrate. Here, the semiconductor layer 22 may also be a Si layer. The sacrificial layer 21 may be, for example, a SiGe layer, and the first mask layer 23 may be, for example, a SiN layer.

Figure 3B:
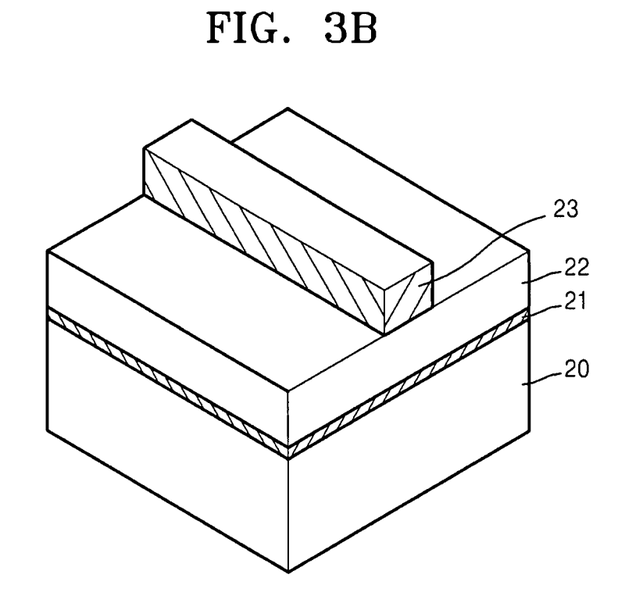

Referring to FIG. 3B, both edges of the first mask layer 23 except the center thereof are removed using a dry etching process. For this, a photoresist pattern (not shown) may be formed on the center of the first mask layer 23, and the edges of the first mask layer 23 may be etched using the photoresist pattern as a mask. In this case, a fluorine gas such as $C_4F_8$ gas to which Ar or $O_2$ is added may be used as an etching gas. Thus, the first mask layer 23 remains only on the center of the semiconductor layer 22 as illustrated in FIG. 3B, so that portions of a top surface of the semiconductor layer 22 are exposed.

Figure 3C:
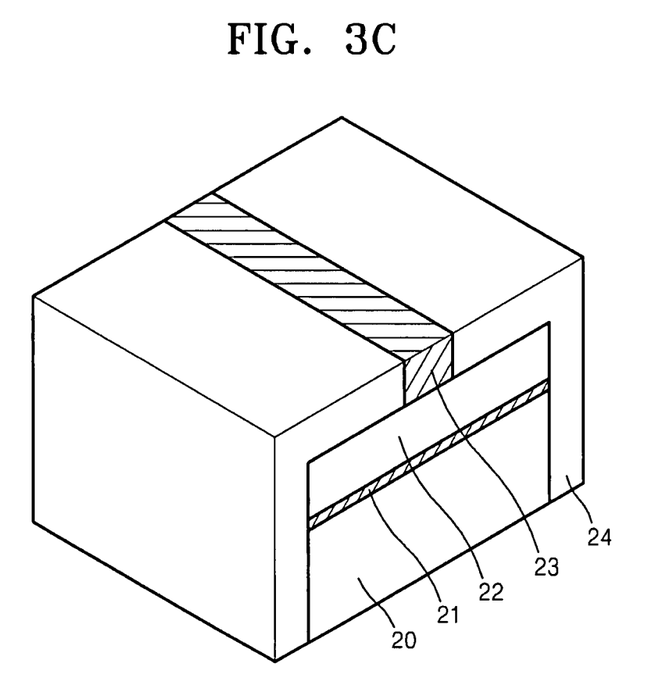

Referring to FIG. 3C, an oxide layer 24 is formed to cover lateral surfaces of the semiconductor substrate 20, the sacrificial layer 21, and the semiconductor layer 22 and the exposed portions of the top surface of the semiconductor layer 22. Here, the oxide layer 24 may be, for example, a $SiO_2$ layer. A top surface of the oxide layer 24 is planarized using, for example, a chemical mechanical polishing (CMP) technique.

Figure 3D:
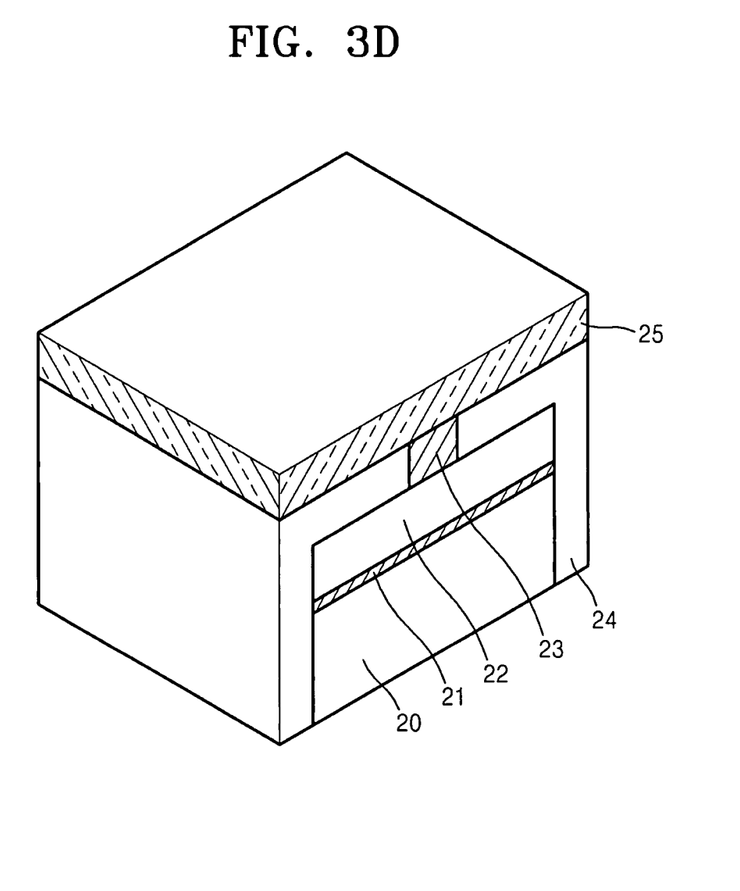

Referring to FIG. 3D, a second mask layer 25 is coated on the entire top surface of the planarized oxide layer 24.

Figure 3E:
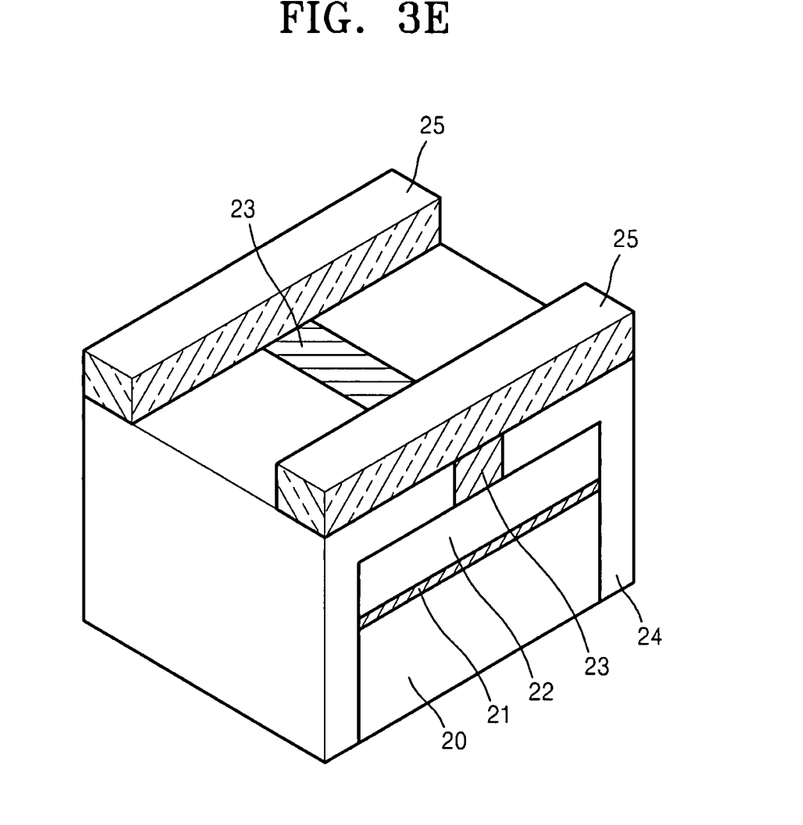

Referring to FIG. 3E, the center of the second mask layer 25 is removed using a dry etching process, thereby partially exposing top surfaces of the oxide layer 24 and the first mask layer 23. Here, the second mask layer 25 is etched in a direction perpendicular to the etching direction of the first mask layer 23. In other words, when etching the first mask layer 23, both sides of the first mask layer 23 except the center thereof are etched in a first direction and as such only a strip of the first mask layer 23 remains extended in the first direction. On the other hand, when etching the second mask layer 25, the center of the second mask layer 25 (excluding both sides thereof is etched in a second direction, wherein the first and second directions are perpendicular to each other. Thus, as illustrated in FIG. 3E, the second mask layer 25 remains on both sides of the top surface of the oxide layer 24, and the top surfaces of the first mask layer 23 and the oxide layer 24 are exposed between the remaining portions of the second mask layer 25.

Figure 3F:
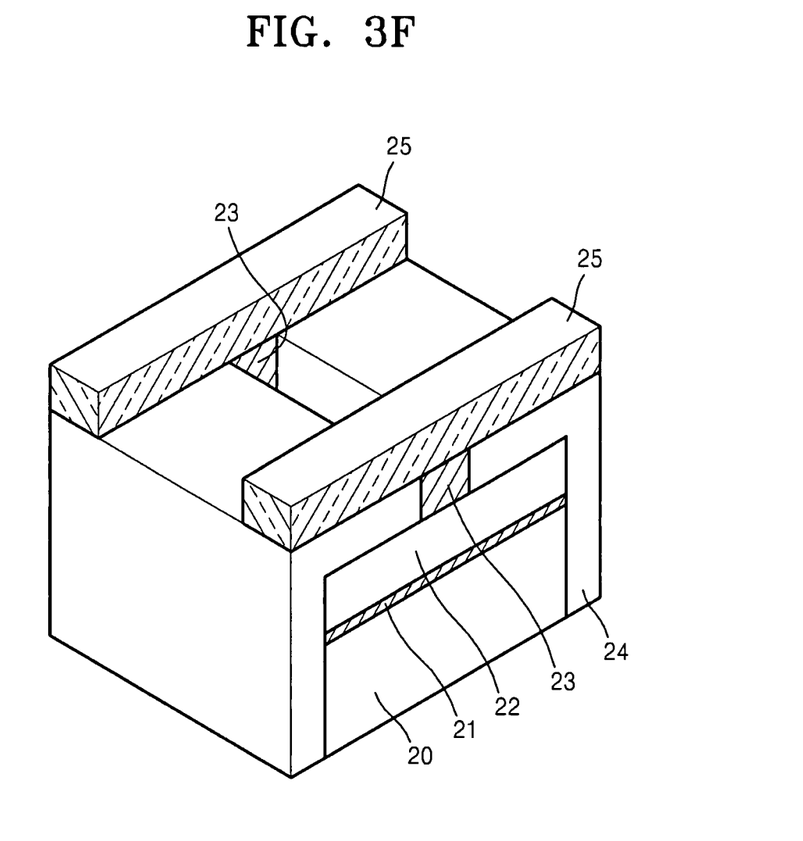

Referring to FIG. 3F, the first mask layer 23 and the semiconductor layer 22, which are disposed between the second mask layers 25 and between the oxide layers 24, are dry etched until a top surface of the sacrificial layer 21 is exposed. Thus, the center of the semiconductor layer 22 is removed and four side outer portions thereof are left. Here, two opposite side portions of the semiconductor layer 22 disposed under the second mask layer 25 correspond to first and second semiconductor protrusions. Also, the remaining two side portions of the semiconductor layer 22 correspond to portions which will each be used to form a semiconductor nanowire during a subsequent process.

Figure 3G:
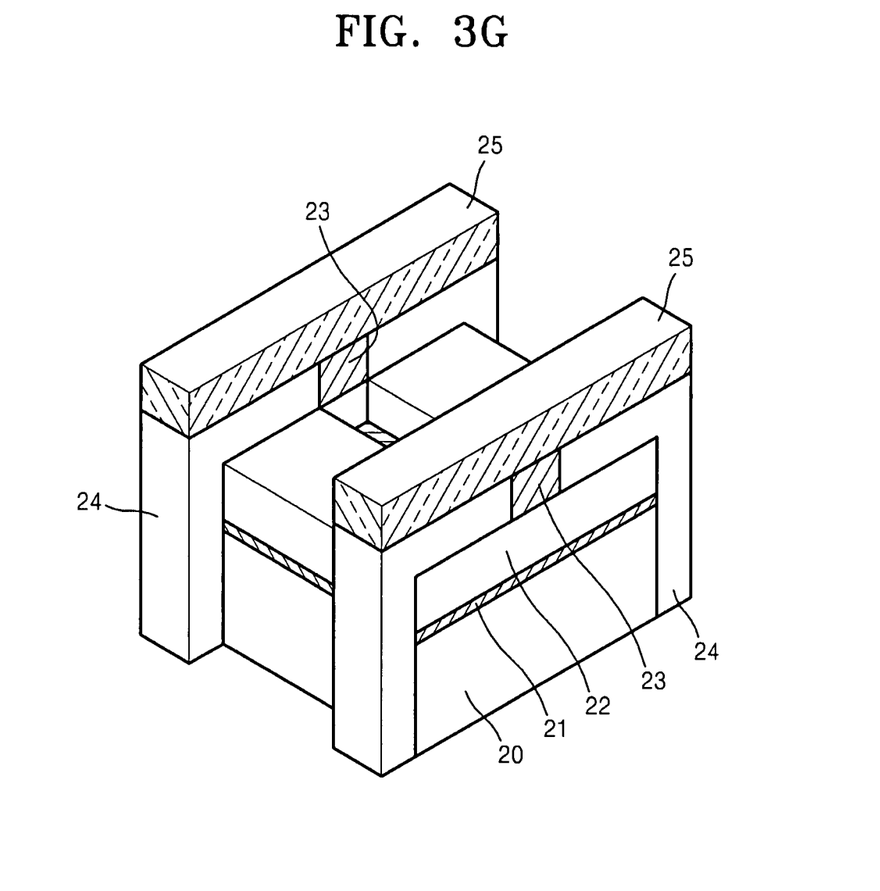

Referring to FIG. 3G, the oxide layer 24 interposed between the second mask layers 25 is removed. Then, the two side portions of the top surface of the semiconductor layer 22 which will each be used to later form the semiconductor nanowire are exposed, and lateral surfaces of the semiconductor substrate 20, the sacrificial layer 21, and the semiconductor layer 22 are exposed.

Figure 3H:
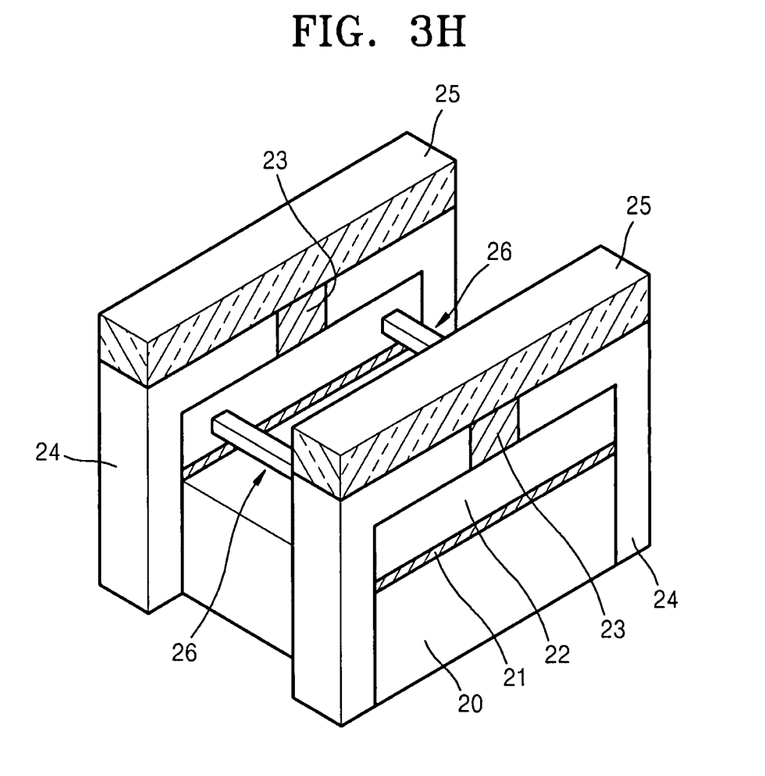

Referring to FIG. 3H, the sacrificial layer 21 interposed between the second mask layers 25 is removed by means of a wet etching process using $H_2O_2$, $NH_4OH$, or HF as an etchant. In this process, the semiconductor layer 22 interposed between the second mask layers 25 is etched, thereby forming a semiconductor nanowire 26 having a very small diameter. The diameter of the semiconductor nanowire 26 may be controlled by adjusting the time the wet etching process is performed for. In this case, since the sacrificial layer 21, which is disposed under the semiconductor layer 22 interposed between the second mask layers 25, is removed, the semiconductor nanowire 26 is suspended between the two side portions of the semiconductor layer 22 that underlies the second mask layer 25.

Figure 3I:
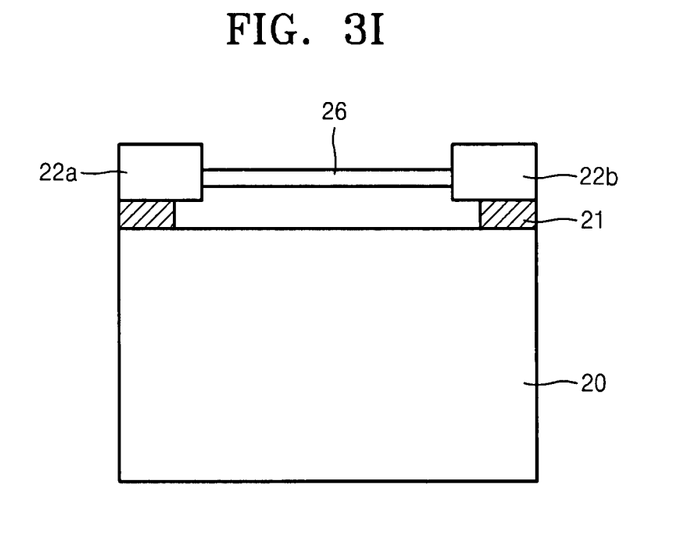

Thereafter, the remaining second mask layer 25 and oxide layer 24 are removed, thereby obtaining the structure shown in a cross-sectional view of FIG. 3I. That is, by removing the second mask layer 25 and the oxide layer 24, two semiconductor protrusions 22a and 22b are formed on the semiconductor substrate 20, and the semiconductor nanowire 26 is connected between the two semiconductor protrusions 22a and 22b. Here, the sacrificial layer 21 is partially left between the semiconductor substrate 20 and the semiconductor protrusions 22a and 22b.

Figure 3J:
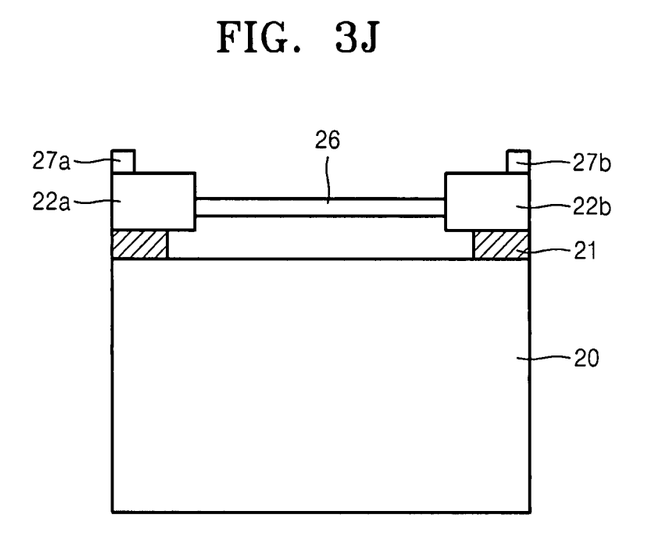

Referring to FIG. 3J, first and second electrodes 27a and 27b are formed on the semiconductor protrusions 22a and 22b, respectively.

Meanwhile, in order to complete the LED, the semiconductor protrusion 22a and one end of the semiconductor nanowire 26 should be doped with P-type impurities, while the semiconductor protrusion 22b and the other end of the semiconductor nanowire 26 should be doped with N-type impurities. The doping process may be performed in two manners.

Figure 4A:
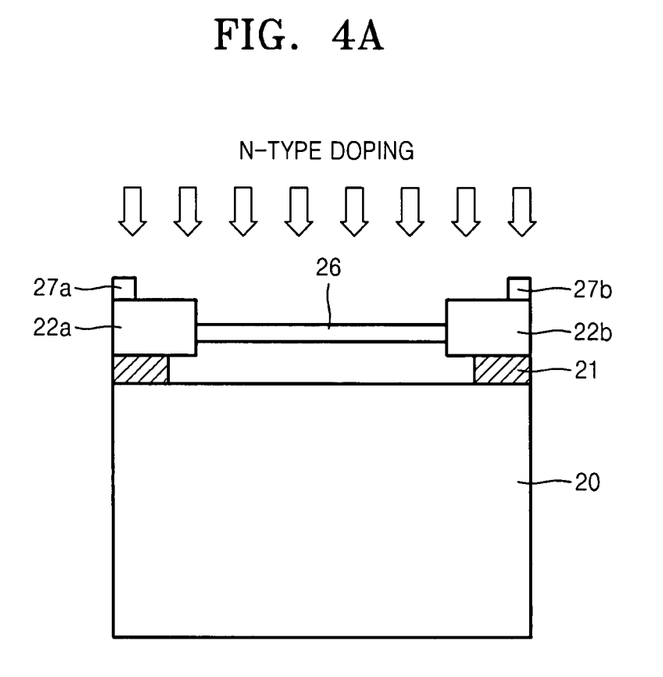
FIGS. 4A and 4B are cross-sectional views illustrating a process of forming a P-N junction by doping Si nanowires in an LED according to an embodiment of the present invention.
Figure 4B:
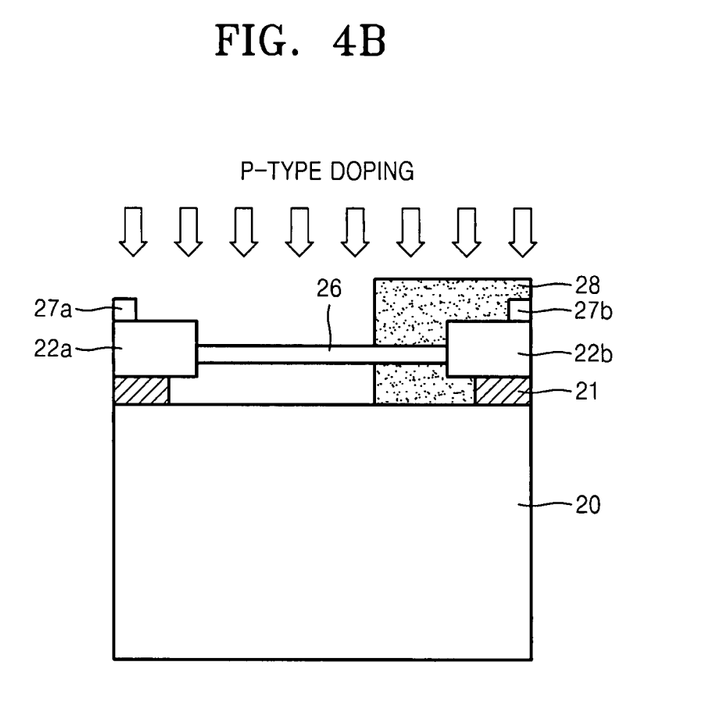

First, as shown in FIG. 4A, the first and second semiconductor protrusions 22a and 22b and the semiconductor nanowire 26 are wholly doped with N-type impurities using ion implantation and diffusion processes. Thereafter, as shown in FIG. 4B, the second semiconductor protrusion 22b and a portion of the semiconductor nanowire 26 extending from the second semiconductor protrusion 22b are coated with resist 28, and the first semiconductor protrusion 22a and the remaining portion of the semiconductor nanowire 26 extending from the first semiconductor protrusion 22a are doped with P-type impurities using ion implantation and diffusion processes. As a result, the first semiconductor protrusion 22a and the portion of the semiconductor nanowire 26 extending from the first semiconductor protrusion 22a are doped with P-type impurities, while the second semiconductor protrusion 22b and the portion of the semiconductor nanowire 26 extending from the second semiconductor protrusion 22b remain doped with N-type impurities. After the P-N doping process is finished, the resist 28 is removed, thereby completing the LED.

Figure 5:
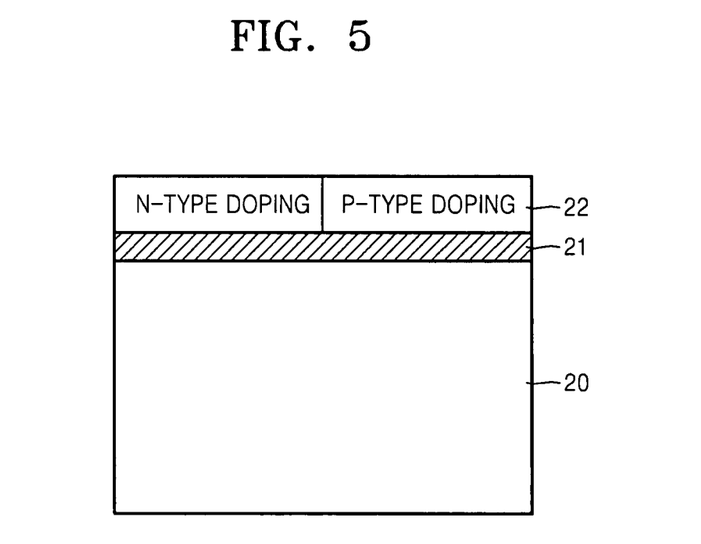
FIG. 5 is a cross-sectional view of a substrate in which a portion where a semiconductor nanowire will be formed is previously doped with impurities.

In another method, after forming the sacrificial layer 21 and the semiconductor layer 22 on the semiconductor substrate 20 as described with reference to FIG. 3A, a P-N doping process may be performed on the semiconductor layer 22 before forming the first mask layer 23. Specifically, after the semiconductor layer 22 is formed, a portion of the semiconductor layer 22 is doped with P-type impurities, and the other portion thereof is doped with N-type impurities. The resultant structure is illustrated in FIG. 5. Here, detailed doping processes may be performed as described with reference to FIGS. 4A and 4B. When the doped semiconductor layer 22 is formed, the first and second semiconductor protrusions 22a and 22b and the semiconductor nanowire 26, which are doped with P-type and N-type impurities, respectively, are naturally formed during the process described with reference to FIGS. 3H and 3I.

As described above, the LED according to the present invention can use silicon (Si) as an emission material, so that well known conventional semiconductor fabrication processes can be employed. Also, when comparing with a conventional LED using III-V or II-VI group semiconductor materials, a P-N doping process is more convenient. Therefore, according to the present invention, the LED can be produced in large quantities at low cost. Furthermore, a low-resistance ohmic contact can be embodied between a semiconductor protrusion and an electrode, thereby further enhancing the luminous efficiency of the LED.

While the present invention has been particularly shown and described with reference to exemplary embodiments thereof, it will be understood by one of ordinary skill in the art that various changes in form and details may be made therein without departing from the spirit and scope of the present invention as defined by the following claims.

What is claimed is:

1. A light emitting diode (LED) comprising:
   a semiconductor substrate;
   first and second semiconductor protrusions disposed on the semiconductor substrate to face each other;
   a semiconductor nanowire suspended between the first and second semiconductor protrusions; and
   first and second electrodes disposed on the first and second protrusions, respectively, the first electrode being flush with a first top edge of the first semiconductor protrusion that is farthest from the semiconductor nanowire, and the second electrode being flush with a second top edge of the second semiconductor protrusion that is farthest from the semiconductor nanowire,
   wherein the first semiconductor protrusion, the semiconductor nanowire, and the second semiconductor protrusion are part of a monolithic body, and wherein the semiconductor nanowire is in the form of a plurality of semiconductor nanowires arranged between the first and second semiconductor protrusions, the plurality of semiconductor nanowires having different diameters ranging from 1.5 nm to 5 nm.

2. The LED of claim 1, wherein the first semiconductor protrusion and a portion of the semiconductor nanowire extending from the first semiconductor protrusion are doped with P-type impurities, and the second semiconductor protrusion and the remaining portion of the semiconductor nanowire extending from the second semiconductor protrusion are doped with N-type impurities.

3. The LED of claim 1, wherein the semiconductor that is used to form the semiconductor substrate, the first and second semiconductor protrusions, and the semiconductor nanowire is formed of one selected from the group consisting of silicon (Si), germanium (Ge), a III-V group compound semiconductor, and a II-VI group compound semiconductor.

4. The LED of claim 1, wherein the semiconductor nanowire is spaced apart from the semiconductor substrate.

5. The LED of claim 1, wherein the first semiconductor protrusion, the semiconductor nanowire, and the second semiconductor protrusion are formed of the same material.

6. A light emitting diode (LED) comprising:
a semiconductor substrate;
first and second semiconductor protrusions disposed on the semiconductor substrate to face each other;
a sacrificial layer disposed between the semiconductor substrate and the first and second semiconductor protrusions;
a semiconductor nanowire suspended between the first and second semiconductor protrusions; and
first and second electrodes disposed on the first and second protrusions, respectively, the first electrode being flush with a first top edge of the first semiconductor protrusion that is farthest from the semiconductor nanowire, and the second electrode being flush with a second top edge of the second semiconductor protrusion that is farthest from the semiconductor nanowire,
wherein the semiconductor nanowire is in the form of a plurality of semiconductor nanowires arranged between the first and second semiconductor protrusions, the plurality of semiconductor nanowires having different diameters ranging from 1.5 nm to 5 nm.

7. A light emitting diode (LED) comprising:
a semiconductor substrate;
first and second semiconductor protrusions disposed on the semiconductor substrate to face each other;
a semiconductor nanowire suspended between the first and second semiconductor protrusions; and
first and second electrodes disposed on the first and second protrusions, respectively, the first electrode being flush with a first top edge of the first semiconductor protrusion that is farthest from the semiconductor nanowire, and the second electrode being flush with a second top edge of the second semiconductor protrusion that is farthest from the semiconductor nanowire,
wherein the first and second semiconductor protrusions are disposed between the first and second electrodes and the semiconductor substrate, the first and second electrodes being smaller than the first and second semiconductor protrusions, and
wherein the semiconductor nanowire is in the form of a plurality of semiconductor nanowires arranged between the first and second semiconductor protrusions, the plurality of semiconductor nanowires having different diameters ranging from 1.5 nm to 5 nm.

8. The LED of claim 1, wherein the first electrode extends along an entire side edge of the first semiconductor protrusion, and the second electrode extends along an entire side edge of the second semiconductor protrusion.

9. The LED of claim 6, wherein the first electrode extends along an entire side edge of the first semiconductor protrusion, and the second electrode extends along an entire side edge of the second semiconductor protrusion.

10. The LED of claim 7, wherein the first electrode extends along an entire side edge of the first semiconductor protrusion, and the second electrode extends along an entire side edge of the second semiconductor protrusion.

* * * * *